(12) United States Patent
Oshida et al.

(10) Patent No.: US 10,896,810 B2
(45) Date of Patent: Jan. 19, 2021

(54) RF GENERATING APPARATUS AND PLASMA TREATMENT APPARATUS

(71) Applicant: HITACHI KOKUSAI ELECTRIC INC., Tokyo (JP)

(72) Inventors: Yoshiyuki Oshida, Tokyo (JP); Naoya Fujimoto, Tokyo (JP); Norikazu Kato, Tokyo (JP); Takeshi Okada, Tokyo (JP); Tsuyoshi Takeda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 16/715,687

(22) Filed: Dec. 16, 2019

(65) Prior Publication Data

US 2020/0118797 A1 Apr. 16, 2020

Related U.S. Application Data

(63) Continuation of application No. PCT/JP2017/023767, filed on Jun. 28, 2017.

(51) Int. Cl.
*H01J 37/32* (2006.01)

(52) U.S. Cl.
CPC ..... *H01J 37/32183* (2013.01); *H01J 37/3211* (2013.01); *H01J 2237/327* (2013.01)

(58) Field of Classification Search
CPC .......... H05H 1/46; H03H 11/30; H03H 11/34; H03H 7/40; H03H 7/46; H01J 37/32; H01J 37/3211; H01J 37/32183; H01J 2237/327
See application file for complete search history.

(56) References Cited

U.S. PATENT DOCUMENTS 4,642,571 A * 2/1987 Minami ............... H01P 5/04
                                                       307/106
5,478,429 A    12/1995 Komino et al.
(Continued)

FOREIGN PATENT DOCUMENTS

JP        6-243992 A     9/1994
JP     2007-163308 A     6/2007
(Continued)

OTHER PUBLICATIONS

International Search Report issued by the Japan Patent Office for corresponding International Patent Application No. PCT/JP2017/023767, dated Sep. 26, 2017, with an English translation.

*Primary Examiner* — Amy Cohen Johnson
*Assistant Examiner* — Syed M Kaiser
(74) *Attorney, Agent, or Firm* — Myers Wolin, LLC

(57) ABSTRACT

To provide a RF generating apparatus that enables apparatus size to be decreased and the cost reduced thereby while also improving power efficiency by performing a stable matching operation, and to provide a plasma treatment apparatus using said apparatus. This RF generating apparatus comprises a plurality of RF generators and matching units, the matching units being provided with only variable-capacity capacitors connected in parallel, thereby reducing the number of elements in terms of the variable-capacity capacitors. A matching calculation section for the RF generators determines, on the basis of traveling waves and reflection waves detected by a detection circuit, the capacity values of the variable-capacity capacitors for the matching units, while adjusting and determining the oscillation frequencies for oscillation circuits in the RF generators so as to decrease the level of the reflection waves. The plasma treatment apparatus uses this RF generating apparatus.

16 Claims, 6 Drawing Sheets

(56) References Cited

U.S. PATENT DOCUMENTS

| | | | |
|---|---|---|---|
| 6,313,584 B1* | 11/2001 | Johnson | H01J 37/32082 315/111.21 |
| 8,643,279 B2* | 2/2014 | Kirchmeier | H03H 7/40 315/111.21 |
| 2003/0215373 A1* | 11/2003 | Reyzelman | H01J 37/32082 422/186.29 |
| 2007/0006972 A1* | 1/2007 | Piptone | H01J 37/32174 156/345.48 |
| 2007/0152678 A1 | 7/2007 | Matoba et al. | |
| 2009/0105980 A1* | 4/2009 | Tetsuka | H01J 37/32935 702/76 |
| 2009/0315596 A1* | 12/2009 | Leming | H03B 21/00 327/119 |
| 2012/0280618 A1* | 11/2012 | Utano | H01J 37/3299 315/111.41 |
| 2014/0009073 A1* | 1/2014 | Valcore, Jr. | H01J 37/32183 315/183 |
| 2014/0263199 A1 | 9/2014 | Nelson et al. | |
| 2014/0345802 A1 | 11/2014 | Umehara et al. | |
| 2015/0371876 A1* | 12/2015 | Terauchi | H01J 37/32082 438/710 |
| 2016/0079037 A1* | 3/2016 | Hirano | H01J 37/32165 156/345.28 |
| 2016/0218766 A1* | 7/2016 | Valcore, Jr. | H04B 1/40 |
| 2017/0103872 A1* | 4/2017 | Howald | H01J 37/32183 |
| 2019/0311885 A1* | 10/2019 | Yuzurihara | H01J 37/32155 |

FOREIGN PATENT DOCUMENTS

| | | |
|---|---|---|
| JP | 2009-206159 A | 9/2009 |
| JP | 2013-125729 A | 6/2013 |
| JP | 2013-197080 A | 9/2013 |
| JP | 2014-072808 A | 4/2014 |
| JP | 2016-521430 A | 7/2016 |
| JP | 6055537 B2 | 12/2016 |

* cited by examiner

RF GENERATING APPARATUS AND PLASMA TREATMENT APPARATUS

This is a Continuation of PCT/JP2017/023767 filed Jun. 28, 2017 and published in Japanese, hereby incorporated by reference.

BACKGROUND OF THE INVENTION

1. Field of the Invention

The present invention relates to a RF (Radio Frequency) generating apparatus used in a plasma treatment apparatus, and particularly to a RF generating apparatus capable of being downsized while improving power efficiency by performing stable matching operation, and to a plasma treatment apparatus using the same.

2. Description of the Related Art

Description of Related Art

A plasma treatment apparatus or a laser treatment apparatus is used as industrial equipment to generate plasma or laser with power supply from a RF generator in order to perform surface treatment or processing using the generated plasma or laser.

In the plasma treatment apparatus, RF power output from the RF generator is impedance-converted at a matching box and supplied to a plasma reactor through an antenna.

The plasma reactor applies a RF voltage to supplied gas to process wafers using the generated plasma.

In a conventional RF generator, the frequency of output RF power is preset to a fixed value, which is not changed during operation.

Further, matching boxes of the conventional RF generator RF generating apparatus include matching circuits, each composed of a variable capacitor and a coil. As the variable capacitors of the matching circuits, a plurality of variable capacitors connected in series and a plurality of variable capacitors connected in parallel are so provided that both will be used to adjust impedance.

Related Techniques

As conventional techniques of the RF generating apparatus, there are Japanese Patent Application Laid-Open No. 2013-197080, "RF POWER SUPPLY DEVICE" (Hitachi Kokusai Electric Inc.: Patent Document 1), and Japanese Patent No. 6055537, "PLASMA PROCESSING APPARATUS" (Tokyo Electron Ltd. and Others: Patent Document 2).

Patent Document 1 describes that power corresponding to the amount of reflected power is added to forward power to control the effective power of a load to a target value.

Patent Document 2 describes that the load impedance is measured stably in a power modulation system configured to modulate RF power into pulses to perform stable matching operation.

CITATION LIST

Patent Documents

Patent Document 1: Japanese Patent Application Laid-Open No. 2013-197080
Patent Document 2: Japanese Patent No. 6055537

However, in the conventional RF generating apparatus, there is a problem that the number of variable capacitors in the matching boxes at which impedance is adjusted becomes large to make the entire apparatus structure large and hence to increase the apparatus cost.

SUMMARY OF THE INVENTION

The present invention has been made in view of the above circumstances, and it is an object thereof to provide a RF generating apparatus capable of reducing the number of variable capacitors to downsize the apparatus and to reduce the cost while performing stable matching operation to improve power efficiency.

According to the present invention, there is provided the RF generating apparatus configured to supply RF power, including: the plurality of RF generators which generate RF power different in frequency; the plurality of antennas installed inside the plasma reactor; and the plurality of matching boxes connected to the antennas to match outputs of the RF generators with one another, each of the RF generators including: the oscillator circuit which oscillates a RF wave having a set oscillation frequency; the arithmetic circuit which calculates a reflected power level and a reflection coefficient from a forward power and a reflected power detected; and the matching arithmetic unit which performs an operation for calculating, based on the reflection coefficient, a control value for the matching box and a candidate value for the oscillation frequency to make the reflected power level small, wherein based on the candidate value for the oscillation frequency, the matching arithmetic unit determines the oscillation frequency to be such a value as to secure a specific frequency difference from an oscillation frequency in any other RF generator to set the oscillation frequency in the oscillator circuit, and the arithmetic circuit includes the band-pass filter having a bandwidth which is twice the specific frequency difference to set a center frequency of a passband of the band-pass filter as the set oscillation frequency. Thus, the RF generating apparatus has advantages of being able to remove an interference wave component caused by RF power from any other RF generator as being out of the passband of the band-pass filter, determine accurate forward power level and reflected power level, perform an accurate matching operation so as to stabilize the matching operation in order to further improve power efficiency.

Further, according to the present invention, there is provided the RF generating apparatus configured to supply RF power, including: the plurality of RF generators which generate RF power different in frequency; the plurality of antennas installed inside the plasma reactor; and the plurality of matching boxes connected to the antennas to match outputs of the RF generators with one another, each of the RF generators including: the oscillator circuit which oscillates a RF wave having a set oscillation frequency; the arithmetic circuit which calculates a reflected power level and a reflection coefficient from a forward power and a reflected power detected; and the matching arithmetic unit which performs an operation for calculating, based on the reflection coefficient, a control value for the matching box and a candidate value for the oscillation frequency to make the reflected power level small, wherein based on the candidate value for the oscillation frequency, the matching arithmetic unit determines the oscillation frequency to be such a value as to secure a specific frequency difference from an oscillation frequency in any other RF generator to set the oscillation frequency in the oscillator circuit, and the arithmetic circuit includes such a low-pass filter as to let a band lower than a cut-off frequency through in order to set the cut-off frequency as a frequency obtained by adding the specific frequency difference to the set oscillation frequency. Thus, the RF generating apparatus has advantages of being able to remove an interference wave component caused by RF power from any other RF generator as being out of the passband of the low-pass filter, determine accurate forward power level and reflected power level, determine accurate forward power level and reflected power level, perform an accurate matching operation so as to stabilize the matching operation in order to further improve power efficiency.

Further, according to the present invention, the above RF generating apparatus is such that, when the specific frequency difference from the oscillation frequency in any other RF generator cannot be secured, the matching arithmetic unit repeats the oscillation frequency operation to forcibly determine such an oscillation frequency as to secure the specific frequency difference after the operation is performed a specific number of times in order to set the oscillation frequency in the oscillator circuit. Thus, the RF generating apparatus has an advantage of being able to set the oscillation frequency capable of removing an interference wave component without fail.

Further, according to the present invention, there is provided the RF generating apparatus configured to supply RF power, including: the plurality of RF generators which generate RF power different in frequency; the plurality of antennas installed inside the plasma reactor; and the plurality of matching boxes connected to the antennas to match outputs of the RF generators with one another, each of the RF generators including: the oscillator circuit which oscillates a RF wave having a set oscillation frequency; the arithmetic circuit which calculates a reflected power level and a reflection coefficient from a forward power and a reflected power detected; and the matching arithmetic unit which performs an operation for calculating, based on the reflection coefficient, a control value for the matching box and a candidate value for the oscillation frequency to make the reflected power level small, and the RF generating apparatus further including the upper apparatus connected to the plurality of RF generators, wherein based on the candidate value for the oscillation frequency, the upper apparatus determines the oscillation frequency to be such a value as to secure a specific frequency difference from an oscillation frequency in any other RF generator to set the oscillation frequency in the oscillator circuit. Thus, the RF generating apparatus has advantages of being able to reduce the influence of an interference wave component caused by RF power from any other RF generator, determine accurate forward power level and reflected power level, perform an accurate matching operation so as to stabilize the matching operation in order to improve power efficiency.

Further, according to the present invention, the above RF generating apparatus is such that the arithmetic circuit includes the band-pass filter having a bandwidth which is twice the specific frequency difference to set a center frequency of a passband of the band-pass filter as the set oscillation frequency. Thus, the RF generating apparatus has advantages of being able to remove an interference wave component caused by RF power from any other RF generator as being out of the passband of the band-pass filter, determine accurate forward power level and reflected power level, perform an accurate matching operation so as to stabilize the matching operation in order to further improve power efficiency.

Further, according to the present invention, the above RF generating apparatus is such that the arithmetic circuit includes such a low-pass filter as to let a band lower than a cut-off frequency through in order to set the cut-off frequency as a frequency obtained by adding the specific frequency difference to the set oscillation frequency. Thus, the RF generating apparatus has advantages of being able to remove an interference wave component caused by RF power from any other RF generator as being out of the passband of the low-pass filter, determine accurate forward power level and reflected power level, perform an accurate matching operation so as to stabilize the matching operation in order to further improve power efficiency.

Further, according to the present invention, the above RF generating apparatus is such that, when the specific frequency difference from the oscillation frequency in any other RF generator cannot be secured, the upper apparatus causes the matching arithmetic unit to repeat the oscillation frequency operation and to forcibly determine such an oscillation frequency as to secure the specific frequency difference after the operation is performed a specific number of times in order to set the oscillation frequency in the oscillator circuit. Thus, the RF generating apparatus has an advantage of being able to set the oscillation frequency capable of removing an interference wave component without fail.

Further, according to the present invention, since the above RF generating apparatus is such that the plurality of antennas are connected to the matching boxes, respectively, there is an advantage of being able to adjust plasma distribution characteristics.

Further, according to the present invention, since there is provided the plasma treatment apparatus using any one of the above RF generating apparatus, there are advantages of being able to downsize the entire apparatus and hence reduce the cost, and perform a stable matching operation so as to improve power efficiency in order to perform proper plasma processing.

DESCRIPTION OF REFERENCE NUMERALS

Figure 1:
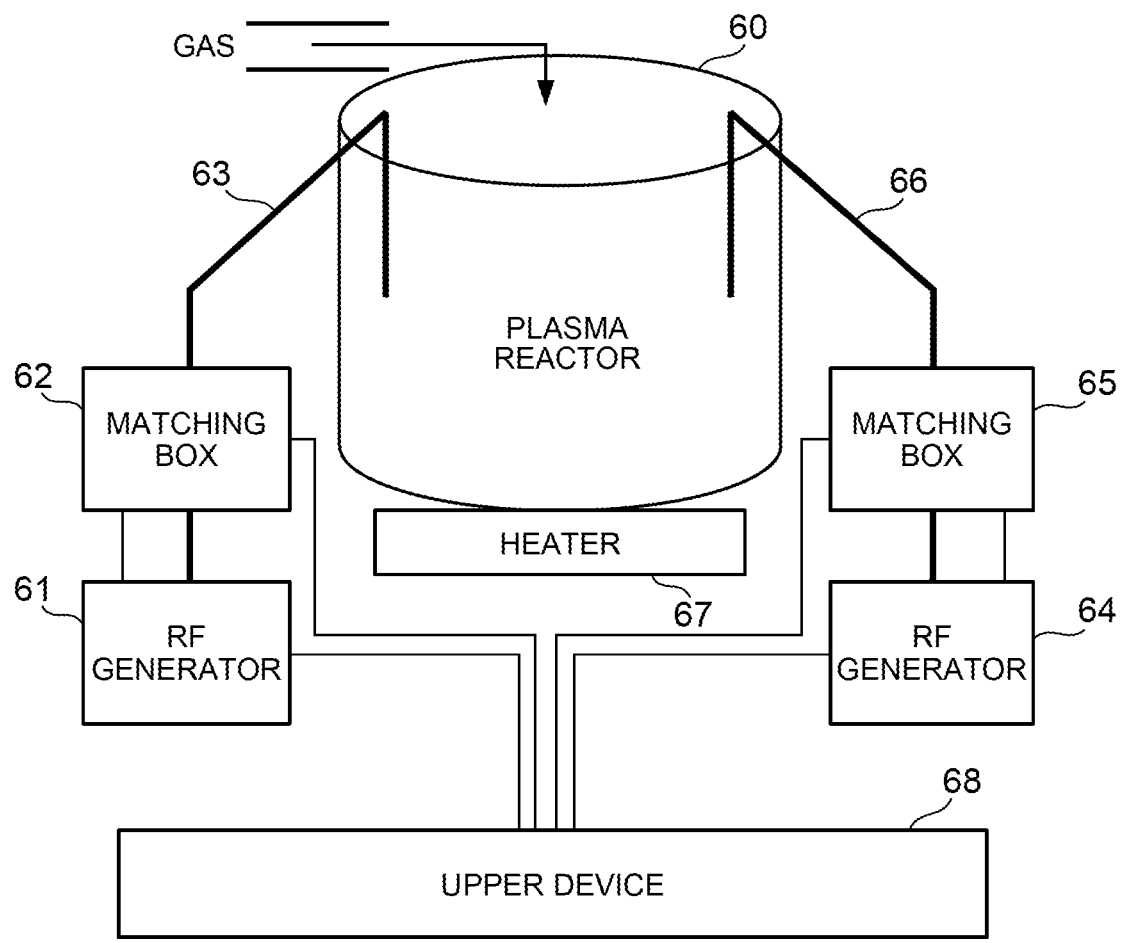
FIG. 1 is a schematic configuration diagram of a plasma treatment apparatus according to a first embodiment of the present invention.

10, 20, 61, 64 . . . RF generator, 11, 21, 71 . . . oscillator circuit, 12, 22, 72 . . . excitation amplifier circuit, 13, 23, 73 . . . main amplifier circuit, 14, 24, 74 . . . detection circuit, 15, 25, 75 . . . A/D converter circuit, 16, 26, 76 . . . arithmetic circuit, 17, 27, 77 . . . matching arithmetic unit, 18, 28, 78 . . . frequency setting circuit, 19, 29 . . . frequency management unit, 62, 65 . . . matching box, 68 . . . upper apparatus, 63, 66 . . . antenna, 50, 53 . . . NCO unit, 51, 54 . . . digital filter, 52, 55 . . . level arithmetic circuit, 81 . . . matching circuit, 82 . . . capacitance setting circuit, 60 . . . plasma reactor

DESCRIPTION OF THE PREFERRED EMBODIMENT

Embodiments of the present invention will be described with reference to the accompanying drawings.

[Overview of Embodiments]

A RF generating apparatus (first RF generating apparatus) according to a first embodiment of the present invention includes a plurality of RF generators and a plurality of matching boxes, where variable capacitors in the matching boxes are connected only in parallel to reduce the number of elements as variable capacitors, and the oscillation frequency of an oscillator circuit in each RF generator is made variable so that impedance will be adjusted by adjusting the oscillation frequency in addition to the matching boxes. Therefore, the matching boxes can be significantly downsized and hence the cost is reduced while improving power efficiency by stable matching operation.

A RF generating apparatus (second RF generating apparatus) according to a second embodiment of the present invention includes a plurality of RF generators and a plurality of matching boxes. In each RF generator, an oscillator circuit generates a RF wave having a set oscillation frequency, a arithmetic circuit calculates a reflected power level and a reflection coefficient from detection signals of a forward power and a reflected power after passing through a band-pass filter or a low-pass filter which lets a specific bandwidth through, and a matching arithmetic circuit calculates a capacitance value at each matching box and a candidate value for the oscillation frequency to make the reflected power level small, and determines, based on the candidate value, such an oscillation frequency as to ensure a specific frequency difference from an oscillation frequency in any other RF generator. In this configuration, the oscillation frequencies in the plurality of RF generators are controlled to be separated from one another by one-half of the frequency difference or more of the pass bandwidth of the band-pass filter in order to remove, with the band-pass filter, an interference wave component mixed with the reflected power. Thus, an accurate reflected power level can be calculated to achieve highly accurate matching in order to improve power efficiency.

Further, since a plasma treatment apparatus according to the embodiment of the present invention includes the RF generating apparatus, the entire apparatus can be downsized and output matching is stabilized to achieve good characteristics such as a plasma distribution so that stable plasma processing can be performed.

[Configuration of Plasma Treatment Apparatus According to First Embodiment: FIG. 1]

The configuration of a plasma treatment apparatus (first plasma treatment apparatus) according to the embodiment of the present invention will be described with reference to FIG. 1. FIG. 1 is a schematic configuration diagram of the plasma treatment apparatus according to the first embodiment of the present invention.

As illustrated in FIG. 1, the first plasma treatment apparatus includes a plasma reactor 60 and a first RF generating apparatus, and the first RF generating apparatus includes RF generators 61, 64, matching boxes 62, 65, antennas 63, 66, and a heater 67.

The RF generator 61, 64 and the matching boxes 62, 65 are connected to an upper apparatus 68 through control lines. Though not illustrated, the heater 67 is also connected to the upper apparatus 68.

In FIG. 1, the thick bold line indicates each supply line of RF power, and the thin solid line indicates each control line.

Each RF generator is a RF generator which amplifies the RF wave generated by the oscillator circuit to output RF power.

The antennas 63, 66 supplies RF power to the plasma reactor 60 as a load apparatus.

The plasma treatment apparatus illustrated in FIG. 1 is such that the plasma reactor 60 receives supply of RF power from a first system having the RF generator 61, the matching box 62, and the antenna 63, and from a second system having the RF generator 64, the matching box 65, and the antenna 66.

The matching box 62 is an impedance matching circuit which matches the output impedance of the RF generator 61 with the input impedance of the load side (the antenna 63 and the plasma reactor 60).

Similarly, the matching box 65 is an impedance matching circuit which matches the output impedance of the RF generator 64 with the input impedance of the load side (the antenna 66 and the plasma reactor 60).

When no matching circuit is included, reflected power from the load apparatus are so generated that only part of the output power can be supplied to the load apparatus, decreasing power efficiency. In order to suppress the reflected power, a matching circuit needs to be provided between the RF generator and the load apparatus.

Here, power supply to the plasma reactor 60 will be described. Power supply from the RF generator 61 as the first system will be described here, but the same applies to the second system.

RF power output from the RF generator 61 is input to the matching box 62 through a RF coaxial cable, subjected to impedance adjustment by a matching circuit inside the matching box 62, and output to the plasma reactor 60 through the antenna 63.

The temperature of the plasma reactor 60 is managed by the upper apparatus 68 controlling the heater 67, and the gas flow rate and pressure thereof are also controlled.

A distribution of plasma generated inside the plasma reactor 60 can be controlled by the number, shape, and arrangement of antennas. In order to reduce damage to wafers and ensure the uniformity of the plasma distribution, it is effective to arrange a plurality of antennas.

Here, only one antenna 63, 66 is provided for one matching box 62, 65, but the configuration may also be such that RF power is distributed from one matching box to a plurality of antennas and output to the plasma reactor 60.

The RF generators 61, 64 can be operated independently of each other under the control of the upper apparatus 68.

The upper apparatus 68 instructs the RF generators 61, 64 to turn on/off the output, sets RF output power, sets a frequency, and presets a capacitance value for a variable capacitor in each of the matching boxes 62, 65 (initial value setting), and the like.

The first RF generating apparatus is different from the conventional apparatuses in terms of the configurations and operation of the matching boxes 62, 65 and the RF generators 61, 64.

In the matching boxes 62, 65, the number of variable capacitors is reduced and only variable capacitors connected in parallel are provided without those connected in series.

Further, in each of the RF generators 61, 64, the oscillation frequency in the oscillator circuit is made variable as will be described later.

In other words, the first RF generating apparatus reduces the number of variable capacitors in the matching boxes 62, 65 to downsize the apparatus and reduce the cost thereof, and adjusts the oscillation frequency in each of the RF generators 61, 64 so that sufficient impedance matching can be performed.

Further, in the first RF generating apparatus as illustrated in FIG. 1, the RF generator 61 and the matching box 62, and the RF generator 64 and the matching box 65 are connected through control lines, respectively. Thus, the first RF generating apparatus has functions such as operation control, abnormality monitoring, and the like.

Note that, in the first RF generating apparatus, the first system including the RF generator 61 and the matching box 62, and the second system including the RF generator 64 and the matching box 65 perform automatic matching processing independently of each other.

Figure 2:
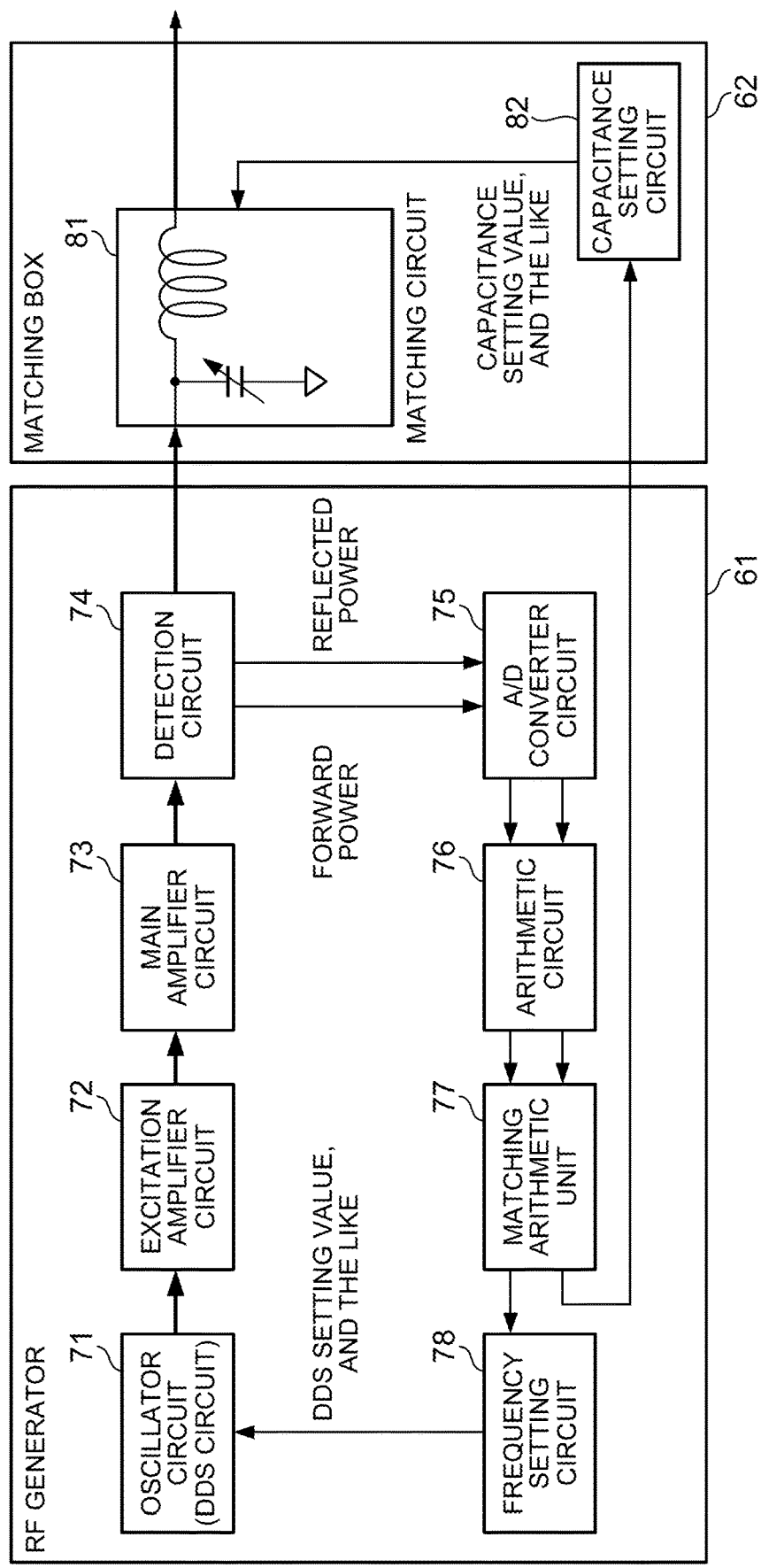
FIG. 2 is a configuration block diagram illustrating the configuration of a first RF generating apparatus.

[RF Generating Apparatus According to First Embodiment: FIG. 2]

Referring next to FIG. 2, the RF generating apparatus (first RF generating apparatus) according to the first embodiment of the present invention will be described. FIG. 2 is a configuration block diagram illustrating the configuration of each RF generator and each matching box of the first RF generating apparatus.

Here, although the RF generator 61 and the matching box 62 in the first system will be described, the configurations and operation of the RF generator 64 and the matching box 65 in the second system are the same as those in FIG. 2.

As illustrated in FIG. 2, the RF generator 61 includes an oscillator circuit 71, an excitation amplifier circuit 72, a main amplifier circuit 73, a detection circuit 74, an A/D converter circuit 75, an arithmetic circuit 76, a matching arithmetic unit 77, and a frequency setting circuit 78.

Further, the matching box 62 includes a matching circuit 81 and a capacitance setting circuit 82.

Each element of the RF generator 61 will be described.

The oscillator circuit 71 is composed of a DDS (Direct Digital Synthesizer) and the like to generate a RF signal with a set frequency.

The excitation amplifier circuit 72 and the main amplifier 73 are used to amplify a RF signal from the oscillator circuit 71 into a predetermined output level. In the example of FIG. 2, one excitation amplifier 72 and one main amplifier 73 are provided respectively, but two or more amplifiers may be provided, respectively, or a distributor or a synthesizer can be used therebetween.

The detection circuit 74 is composed of a directional coupler and the like to detect forward power and reflected power so as to output respective monitor signals.

The A/D converter circuit 75 converts each monitor signal as an analog signal into a digital signal.

The arithmetic circuit 76 performs an operation for calculating, from input signals, the level of a forward power and the level of a reflected power to determine a reflection coefficient from the levels and phases of the forward power and the reflected power.

The matching arithmetic unit 77 determines, based on the reflection coefficient, a capacitance value for the variable capacitor in the matching circuit 81 to make the reflection level small, and determines a frequency value for the oscillator circuit 71 to make the reflection level small as a feature of the first RF generating apparatus.

The frequency setting circuit 78 sets, as the oscillation frequency of the oscillator circuit 71 (DDS setting value, and the like in FIG. 2), the frequency value input from the matching arithmetic unit 77.

The matching circuit 81 of the matching box 62 includes a variable capacitor and a coil to adjust the impedance of the input RF signal and output it to the antenna 63. Note that only variable capacitors connected in parallel are provided as variable capacitors without providing variable capacitors connected in series to reduce the number of elements compared with the conventional apparatuses.

When the determined capacitance value is input from the matching arithmetic unit 77 of the RF generator 61, the capacitance setting circuit 82 sets the capacitance value in the variable capacitor of the matching circuit 81.

In the configuration of FIG. 2, a feedback system from the detection circuit 74 to the matching arithmetic unit 77 is provided in the RF generator 61 alone to calculate, in the matching arithmetic unit 77, both the oscillation frequency and the capacitance value for the variable capacitor, but the same circuit structure may be provided in the matching box 62 alone, or may be provided in both the RF generator 61 and the matching box 62 in such a manner as to calculate the frequency in the RF generator 61 and calculate the capacitance value in the matching box 62, respectively.

Further, one antenna is provided here for each of the matching boxes 62, 65, respectively, but two or more antennas may be provided.

[Operation of First RF Generating Apparatus: FIG. 2]

Referring next to FIG. 2, the operation of the first RF generating apparatus will be described.

In the RF generator 61, the RF signal generated by the oscillator circuit 71 is amplified by the excitation amplifier circuit 72 and the main amplifier circuit 73 into a predetermined level, and output to the matching box 62 through the detection circuit 74.

The RF signal input to the matching box 62 is subjected to impedance adjustment in the matching circuit 81, and output to the plasma reactor 60 through the antenna 63.

On the other hand, a forward power and a reflected power are detected in the detection circuit 74 of the RF generator 61, monitor signals thereof are input to the A/D converter circuit 75 and converted to digital signals, and the levels of the forward power and the reflected power and a reflection coefficient are calculated in the arithmetic circuit 76, and output to the matching arithmetic unit 77.

Then, in the matching arithmetic unit 77, the frequency value for the oscillator circuit 71 and the capacitance value for the variable capacitor of the matching circuit 81 are determined to make the reflection level small, and output to the frequency setting circuit 78 and the capacitance setting circuit 82, respectively.

Note that the frequency value and the capacitance value are experimentally predetermined and stored in the matching arithmetic unit 77 in association with the input reflection level and the reflection coefficient.

The frequency value input to the frequency setting circuit 78 is set in the oscillator circuit 71 to adjust the oscillation frequency in the oscillator circuit 71.

Further, the capacitance value input to the capacitance setting circuit 82 is set in the variable capacitor of the matching circuit 81.

Thus, in the first RF generating apparatus, both the oscillation frequency of the RF generator 61 and the capacitance value for the matching box 62 are so adjusted that impedance adjustment enough to make the reflected power level small can be performed even when the number of variable capacitors of respective matching boxes 62 is reduced.

The same applies to the operation of the RF generator 64 and the matching box 65 in the second system.

Then, as described above, the capacitance values for the variable capacitors of the matching circuits 63, 65 and the output frequencies of the RF generators 61, 64 are adjusted in the first system and the second system to reduce reflection power independently of each other.

[Effects of First Embodiment]

According to the first RF generating apparatus, the number of elements as variable capacitors is reduced in the matching boxes 62, 65, and the RF generators 61, 64 determines the capacitance values for variable capacitors of the matching boxes 62, 65 based on the forward power and the reflected power detected by the detection circuit to make the level of reflected power small, and determines the oscillation frequencies in the oscillator circuits. Thus, the apparatus can be downsized and hence the cost can be reduced, and there is an advantage of being able to perform sufficient impedance adjustment by using the adjustment of the oscillation frequency to compensate for the amount of adjustment of the variable capacitor to improve power efficiency by stable matching operation.

Further, according to the first plasma treatment apparatus, since such a first RF generating apparatus as to reduce the number of variable capacitors in the matching boxes 62, 65 and make the oscillation frequency of the RF generators 61, 64 variable is provided, the apparatus can be downsized and hence the cost can be reduced to achieve good characteristics such as a plasma distribution so that stable plasma processing can be performed.

Figure 3:
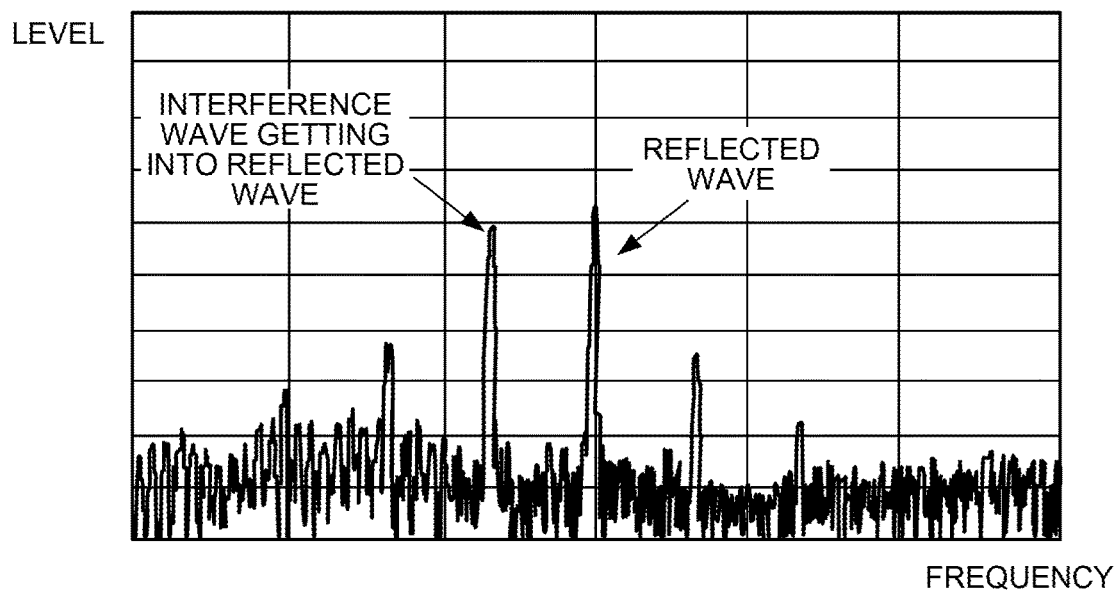
FIG. 3 is an explanatory diagram illustrating an example when an interference wave is observed in a detection circuit for reflected power.

[Interference Wave/Intermodulation Wave: FIG. 3]

As illustrated in FIG. 1, when both the RF generator 61 and the RF generator 64 output RF power, power is applied from two RF generators inside the plasma reactor 60. Therefore, an interference wave or an intermodulation wave is generated.

In other words, in the example of FIG. 1, since RF power output from the antenna 66 using one RF generator 64 as the power source reaches the other RF generator 61 through the plasma reactor 60 and the antenna 63, an interference wave or an intermodulation wave is contained in a forward power and a reflected power observed by the RF generator 61.

Suppose that the interference wave or the intermodulation wave is observed in the detection circuit for detecting forward power. In this case, when the level of the interference wave or the intermodulation wave is small enough not to affect the forward power detection level, there is no problem, while when the level of the interference wave or the intermodulation wave cannot be ignored, a forward power detection level higher than an actual level is detected.

Therefore, the RF generator 61 performs control to reduce output of the RF generator 61 so as to converge the detection level of a forward power to a set value.

This leads to reducing power applied to the plasma reactor 60, and hence there is a danger that the stability of plasma ignition will be reduced, that the plasma density inside the plasma reactor 60 will be decreased even if plasma is ignited, and that the plasma processing rate will be reduced due to these effects.

Here, an example in which an interference wave is observed in the detection circuit for reflected power is illustrated in FIG. 3. FIG. 3 is an explanatory chart illustrating the example in which an interference wave is observed in the detection circuit for reflected power.

As illustrated in FIG. 3, interference wave levels that cannot be ignored are observed with respect to reflected power in a central part of the screen.

Thus, when the level of an interference wave or an intermodulation wave cannot be ignored, the detection level of a reflected power is detected to be higher than the actual level.

Therefore, the RF generator 61 performs automatic matching control, such as to change the set frequency and capacitance value so as to converge the detection level of the reflected power to zero.

However, since interference waves derived from the RF generator 64 continue to be detected as reflected power, the automatic matching is not completed, and the matching operation may be continuously retried.

This may cause an influence such as to make plasma inside the plasma reactor 60 fluctuate or make the plasma processing rate fluctuate to destabilize the operation.

[Interference Countermeasures]

As a countermeasure for the problem that an interference wave or an intermodulation wave caused by another RF generator gets into a forward power or a reflected power during detection of forward power or reflected power, there is a method of inserting an isolator in the detection circuit.

However, when the isolator is inserted, it is effective in detecting forward power, but reflected power are removed by the influence of the isolator to make it impossible to detect the reflected power. Further, in this case, the cost is high and hence impractical.

It is also considered a method of adding a fixed filter circuit to the detection circuit. The effect of this method can be expected when the oscillator circuit works at a fixed frequency.

However, there may be a case where the frequency of an interference wave becomes a frequency close to that of a reflected power to be detected to make it difficult to remove it with the fixed filter. Further, in a configuration capable of changing the frequency of the oscillator circuit as in FIG. 2, since the frequency of the interference wave also fluctuate, it is difficult to remove the interference wave.

[Plasma Treatment Apparatus according to Second Embodiment]

As described above, when a plurality of power sources are included in the first RF generating apparatus, since the level of a forward power or a reflected power cannot be detected accurately due to an interference wave or an intermodulation wave caused by RF power from another power source, there is a danger that stable matching operation cannot be performed, thereby reducing power efficiency.

Therefore, in a RF generating apparatus (second RF generating apparatus) and a plasma treatment apparatus (second plasma treatment apparatus) according to a second embodiment of the present invention, it is an object to provide a RF generating apparatus capable of removing interference waves or intermodulation waves to perform further stable matching operation in order to further improve power efficiency, and a plasma treatment apparatus capable of performing stable plasma processing.

Figure 4:
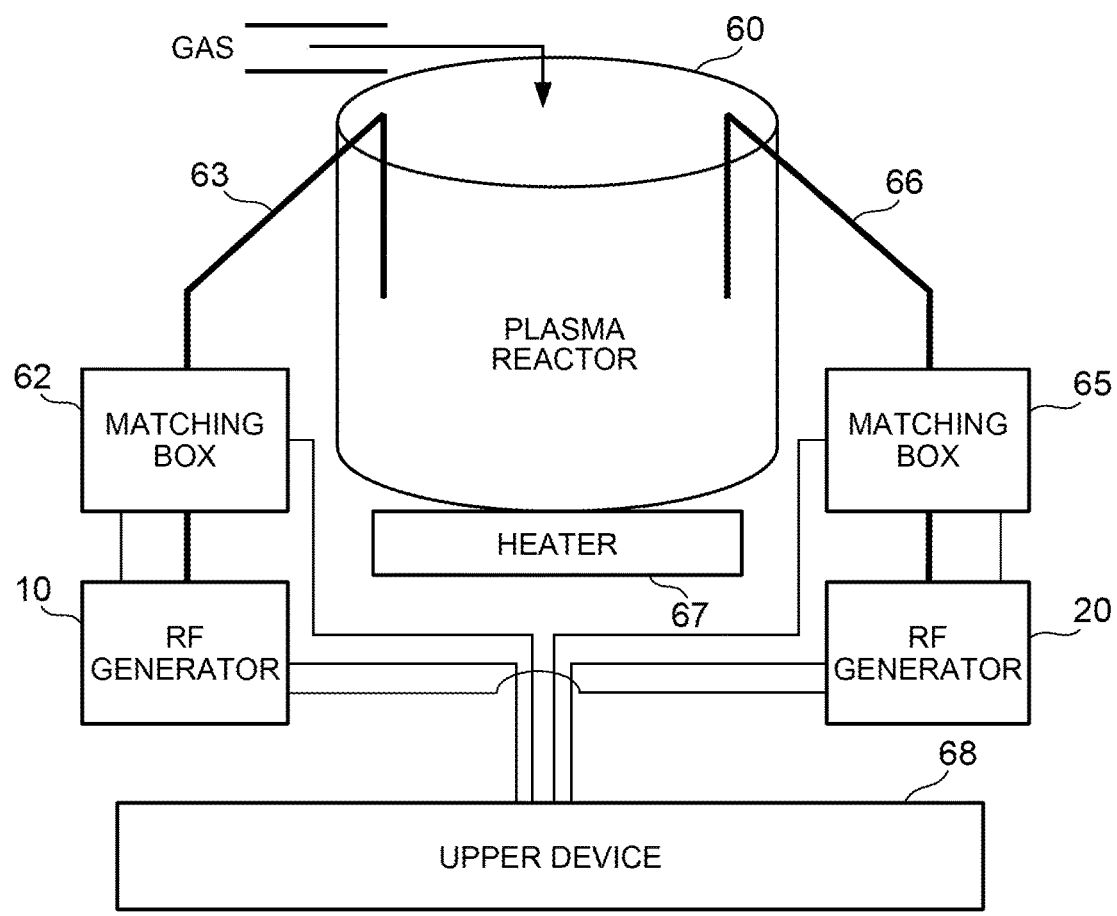
FIG. 4 is a schematic configuration diagram of a second plasma treatment apparatus.

[Configuration of Second Plasma Treatment Apparatus: FIG. 4]

The configuration of the second plasma treatment apparatus will be described with reference to FIG. 4. FIG. 4 is a schematic configuration diagram of the second plasma treatment apparatus. Note that the same components as those in the above-described first plasma treatment apparatus are given the same reference numerals.

As illustrated in FIG. 4, the second plasma treatment apparatus includes the plasma reactor 60 and a second RF generating apparatus. The second RF generating apparatus includes a first system having a RF generator 10, the matching box 61, and the antenna 63, and a second system having a RF generator 20, the matching box 65, and the antenna 66.

In the second RF generating apparatus, the configurations and operation of the RF generators 10, 20 are different from those in the first RF generating apparatus, i.e., the oscillation frequency in the oscillator circuit is determined by the two RF generators 10, 20 in conjunction with each other.

Therefore, in FIG. 4, the two RF generators 10, 20 are connected to each other through a control line.

Figure 5:
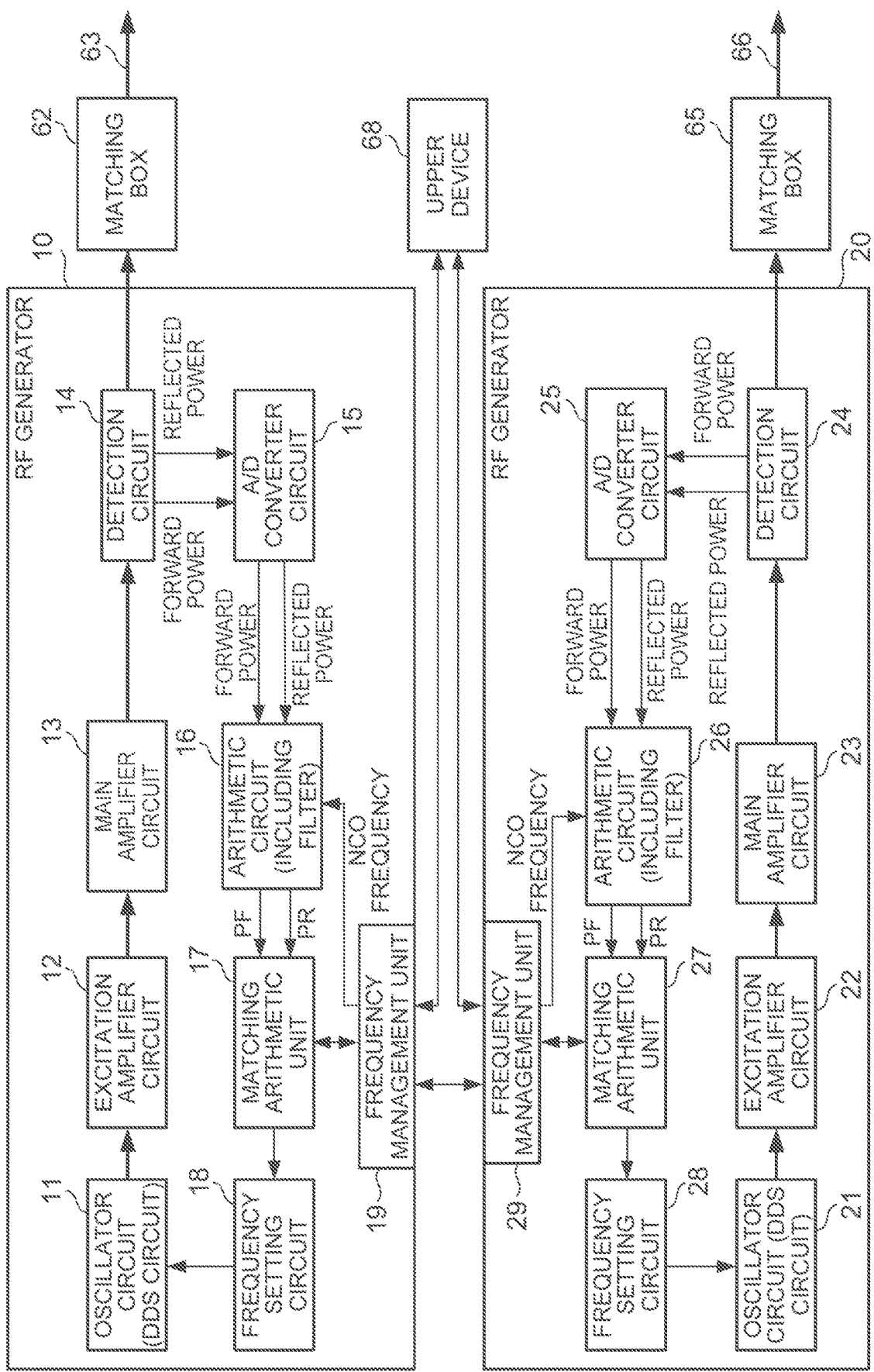
FIG. 5 is a configuration block diagram illustrating the configuration of a second high-frequency power source device.

[Configuration of Second RF Generating Apparatus: FIG. 5]

The configuration of the second RF generating apparatus will be described with reference to FIG. 5. FIG. 5 is a configuration block diagram illustrating the configuration of the second RF generating apparatus.

As illustrated in FIG. 5, the RF generator 10 and the RF generator 20 are equivalent in basic configuration to each other, but it is assumed, for convenience, that the RF generator 10 is set as a master unit and the RF generator 20 is set as a slave unit, where the RF generator 10 as the master unit performs frequency interlock processing as a feature of the second RF generating apparatus to control output frequencies of RF power in conjunction with each other.

The configurations and operation of the matching box 62 and the matching box 65 are the same as those in the first RF generating apparatus, where the number of elements as variable capacitors is small compared with the conventional apparatuses and impedance matching is performed on input RF power and output to the plasma reactor 60 through the antennas 63, 66.

[Configuration of RF Generator 10: FIG. 5]

The configuration of the RF generator 10 will be described with reference to FIG. 5.

In the RF generator 10 illustrated in FIG. 5, an oscillator circuit 11, an excitation amplifier circuit 12, a main amplifier circuit 13, a detection circuit 14, an A/D converter circuit 15, and a frequency setting circuit 18 are the same as those of the first RF generating apparatus illustrated in FIG. 2. Further, as a feature of the second RF generating apparatus, a frequency management unit 19 is included, and the configurations and operation of an arithmetic circuit 16 and a matching arithmetic unit 17 are different from those in the first RF generating apparatus.

Since the configurations and operation of the same circuits as those in the first RF generating apparatus are the same as those in the conventional apparatuses, the detailed description thereof will be omitted.

The features of the RF generator 10 will be described.

Figure 6:
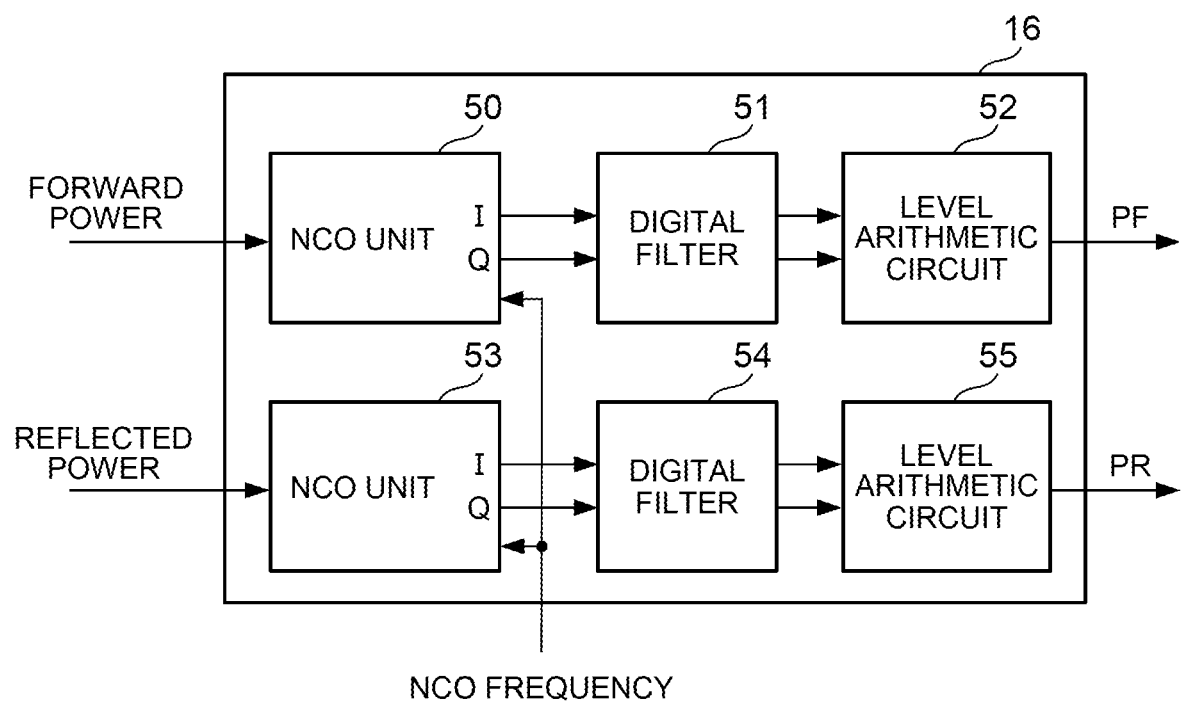
FIG. 6 is a schematic configuration diagram of an arithmetic circuit 16.

[Arithmetic circuit 16: FIG. 6]

Detection signals (monitor signals) of forward power and reflected power detected by the detection circuit 14 and converted to digital signals by the A/D converter circuit 15 are input to the arithmetic circuit 16 to detect respective signal levels.

The configuration of the arithmetic circuit 16 will be described with reference to FIG. 6. FIG. 6 is a schematic configuration diagram of the arithmetic circuit 16.

As illustrated in FIG. 6, the arithmetic circuit 16 includes an NCO (Numerical Controlled Oscillator) unit 50 which performs processing on forward power, a digital filter 51, a level arithmetic circuit 52, an NCO unit 53 which performs processing on reflected power, a digital filter 54, and a level arithmetic circuit 55.

The NCO unit 50 includes an NCO and a multiplier which generate a sin wave and a cos wave to multiply an input forward power signal by the sin wave and the cos wave, respectively, so as to output an in-phase (I) component and a quadrature (Q) component of the forward power.

Since an NCO frequency is set in conjunction with the frequency of a RF wave, a desired wave (input forward power signal) becomes a baseband signal as a result of an NCO output operation.

In the NCO unit 50, an NCO frequency tuned into the output frequency of the RF generator 10 (the oscillation frequency of the oscillator circuit 11) is set from a frequency management unit 19 to be described later.

In other words, in the second RF generating apparatus, the NCO frequency is changed in conjunction with the frequency set in the oscillator circuit 11.

The digital filter 51 is a band-pass filter which lets a specific band through around the output frequency of RF power to remove an interference wave or an intermodulation wave (hereinafter called the interference wave component) from the in-phase component and the quadrature component of a forward power input at an operation sampling frequency.

Specifically, the digital filter 51 lets a band of a specific frequency width (for example, ±10 kHz) through from a center frequency and the other bands are attenuated to remove an interference wave component caused by the RF generator 20.

In other words, the passband of the digital filter 51 is twice the specific bandwidth (here, 10 kHz).

Here, the digital filter 51 is such that, since the frequency set in the NCO of the NCO unit 50 is set to be equal to the frequency of the oscillator circuit 11, the frequency becomes the center frequency of the passband.

Thus, even when the frequency of the oscillator circuit 11 varies, the digital filter 51 can let only the band of ±10 kHz around the frequency of RF power through to remove any interference wave component separated by the frequency or more from the band without fail.

The level arithmetic circuit 52 receives input of the in-phase component and the quadrature component of a forward power from which the interference wave component is removed to calculate the power level of the forward power (forward power level, PF).

Thus, an accurate forward power level without the influence of the interference wave is calculated and output to the matching arithmetic unit 17.

The NCO unit 53, the digital filter 54, and the level arithmetic circuit 55 perform, on a reflected power, processing similar to that of the NCO unit 50, the digital filter 51, and the level arithmetic circuit 52, respectively.

Specifically, the NCO unit 53 includes an NCO and a multiplier to multiply an input reflected power by a sin wave and a cos wave so as to output an in-phase component and a quadrature component of the reflected power.

The digital filter 54 limits the band of the in-phase component and the quadrature component of the input reflected power to let only the specific band (here, ±10 kHz) through using the frequency of RF power as the center frequency so as to remove an interference wave component.

The level arithmetic circuit 55 calculates an accurate power level of the reflected power without the influence of the interference wave (reflected power level, PR) and outputs the power level of the reflected power to the matching arithmetic unit 17.

Though not illustrated here, a reflection coefficient is calculated by the arithmetic circuit 16 in the same manner as in the conventional, and output to the matching arithmetic unit 17.

[Matching Arithmetic Unit 17: FIG. 5]

Returning to FIG. 5, the matching arithmetic unit 17 calculates an oscillation frequency to be set in the oscillator circuit 11 and a capacitance value for the variable capacitor of the matching box 62 based on the input forward power level, the input reflected power level, and the input reflection coefficient in the same manner as in the first RF generating apparatus to make the reflected power level small to perform matching arithmetic processing so as to output the calculated capacitance value to the matching box 62 in the same manner as in the first RF generating apparatus.

Note that, since setting of the capacitance value from the matching arithmetic unit 17 to the matching box 62 is the same operation as that in the first RF generating apparatus, this is omitted in FIG. 5.

Note further that a component including the matching arithmetic unit 17 and the frequency setting circuit 18 is called a matching arithmetic unit in the appended claims.

Then, as the feature of the second RF generating apparatus, the matching arithmetic unit 17 of the RF generator 10 performs such frequency interlock processing as to compare the calculated value of the oscillation frequency (candidate frequency) with the oscillation frequency of the RF generator 20 as the other power source, and check whether an interference wave component is removable or not in order to output an appropriate frequency value to the frequency setting circuit 18, rather than to output the value of the oscillation frequency calculated in the matching arithmetic processing directly to the frequency setting circuit 18.

Specifically, in the RF generator 10, the frequency of the oscillator circuit 11 is set to be separated by a specific frequency (here, 10 kHz) or more from the oscillation frequency of the RF generator 20 so that an interference wave component based on RF power from the RF generator 20 can be removed by the digital filters 51, 54 without fail.

As will be described later, the frequency interlock processing enables the digital filters of the arithmetic circuits 16, 26 in the RF generator 10 and the RF generator 20 to attenuate a band enough to separate an interference wave component caused by the other power source by 10 kHz or more from the center frequency in order to remove the interference wave component without fail.

[Frequency Management Unit 19: FIG. 5]

The frequency management unit 19 is another feature of the second RF generating apparatus to hold the value of the oscillation frequency (first oscillation frequency) input from the matching arithmetic unit 17 and to be set in the oscillator circuit 11, and to set the frequency of the NCO in the arithmetic circuit 16 in tune therewith.

Further, the frequency management unit 19 receives and internally holds the value of the oscillation frequency (second oscillation frequency) output from a frequency management unit 29 of the RF generator 20 to output the value of the second oscillation frequency to the matching arithmetic unit 17 in response to a request from the matching arithmetic unit 17.

[RF Generator 20: FIG. 5]

Although the RF generator 20 has the same configuration as that of the RF generator 10, since it operates as a slave unit here, the RF generator 20 sets the calculated candidate frequency directly as the oscillation frequency without performing frequency interlock processing.

In the RF generator 20, an oscillator circuit 21, an excitation amplifier circuit 22, a main amplifier circuit 23, a detection circuit 24, and an A/D converter circuit 25 are the same as those in the first RF generating apparatus and the conventional apparatuses, and the configurations and operation of an arithmetic circuit 26 and a frequency setting circuit 28 are the same as those in the RF generator 10 described above.

Further, like in the RF generator 10, although a matching arithmetic unit 27 and the matching box 65 are connected by a control line, the connection is omitted in FIG. 5.

The matching arithmetic unit 27 of the RF generator 20 operating as the slave unit uses the forward power level, the reflected power level, and the reflection coefficient input from the arithmetic circuit 26 to determine the frequency of the oscillator circuit 21 (second oscillation frequency) so as to make the reflected power level small, and performs matching arithmetic processing for determining the capacitance value for the variable capacitor of the matching box 65.

Then, the determined frequency is output to the frequency setting circuit 28 and the frequency management unit 29 in order to output the capacitance value to the matching box 65.

The frequency management unit 29 internally holds the value of the second oscillation frequency and outputs the value to the frequency management unit 19 of the RF generator.

Further, the frequency management unit 29 sets an NCO frequency in the arithmetic circuit 26 in tune with the value of the second oscillation frequency.

[Operation of Second RF Generating Apparatus: FIG. 5 and FIG. 6]

The operation of the second RF generating apparatus will be described with reference to FIG. 5 and FIG. 6. The description will be made basically on the first system, and the second system will be described in terms of only portions different from the first system.

As illustrated in FIG. 5, in the RF generator 10, the oscillator circuit 11 oscillates the set first oscillation frequency to output RF power. The RF power is amplified by the excitation amplifier circuit 12 and the main amplifier circuit 13 up to a predetermined level, and output to the matching box 62 through the detection circuit 14.

In the matching box 62, the RF power is subjected to impedance matching, and output to the plasma reactor 60 through the antenna 63.

In the detection circuit 14, a forward power and a reflected power are detected, input as monitor signals to the A/D converter circuit 15, and converted to digital signals.

Then, in the arithmetic circuit 16, the forward power and the reflected power are subjected to quadrature detection, respectively, to extract an in-phase component and a quadrature component, and then subjected to band limitation by the digital filters 51, 54, respectively, to remove interference wave components so that a forward power level, a reflected power level, and a reflection coefficient will be calculated by the level arithmetic circuits 52, 55.

Then, in the matching arithmetic unit 17, the input reflected power level and the like are used to calculate a candidate frequency value to make the reflected power level small and to be set in the oscillator circuit 11, and to calculate a capacitance value to be set for the variable capacitor of the matching box 62 so as to output the capacitance value to the matching box 62.

Further, in the matching arithmetic unit 17, as frequency interlock processing, the oscillation frequency of the second RF generator 20 (second oscillation frequency) is acquired from the frequency management unit 19 to compare the calculated candidate frequency with the second oscillation frequency and perform frequency interlock processing so that a difference between the candidate frequency and the second oscillation frequency will become a specific frequency or more in order to determine the candidate frequency as the oscillation frequency (first oscillation frequency) of the oscillator circuit 11 when the difference is the specific frequency or more.

The first oscillation frequency is set in the oscillator circuit 11 through the frequency setting circuit 18.

On the other hand, in the RF generator 20, the capacitance value and the second oscillation frequency are calculated in the matching arithmetic unit 27, the capacitance value is set in the matching box 65, and the second oscillation frequency is set in the oscillator circuit 21 through the frequency setting circuit 28.

Further, the second oscillation frequency is output to the frequency management unit 29, held in the frequency management unit 29, and output to the frequency management unit 19 of the first RF generator 10 so that the second oscillation frequency will be used in the frequency interlock processing in the matching arithmetic unit 17.

The operation of the RF generating apparatus is thus carried out.

Figure 7:
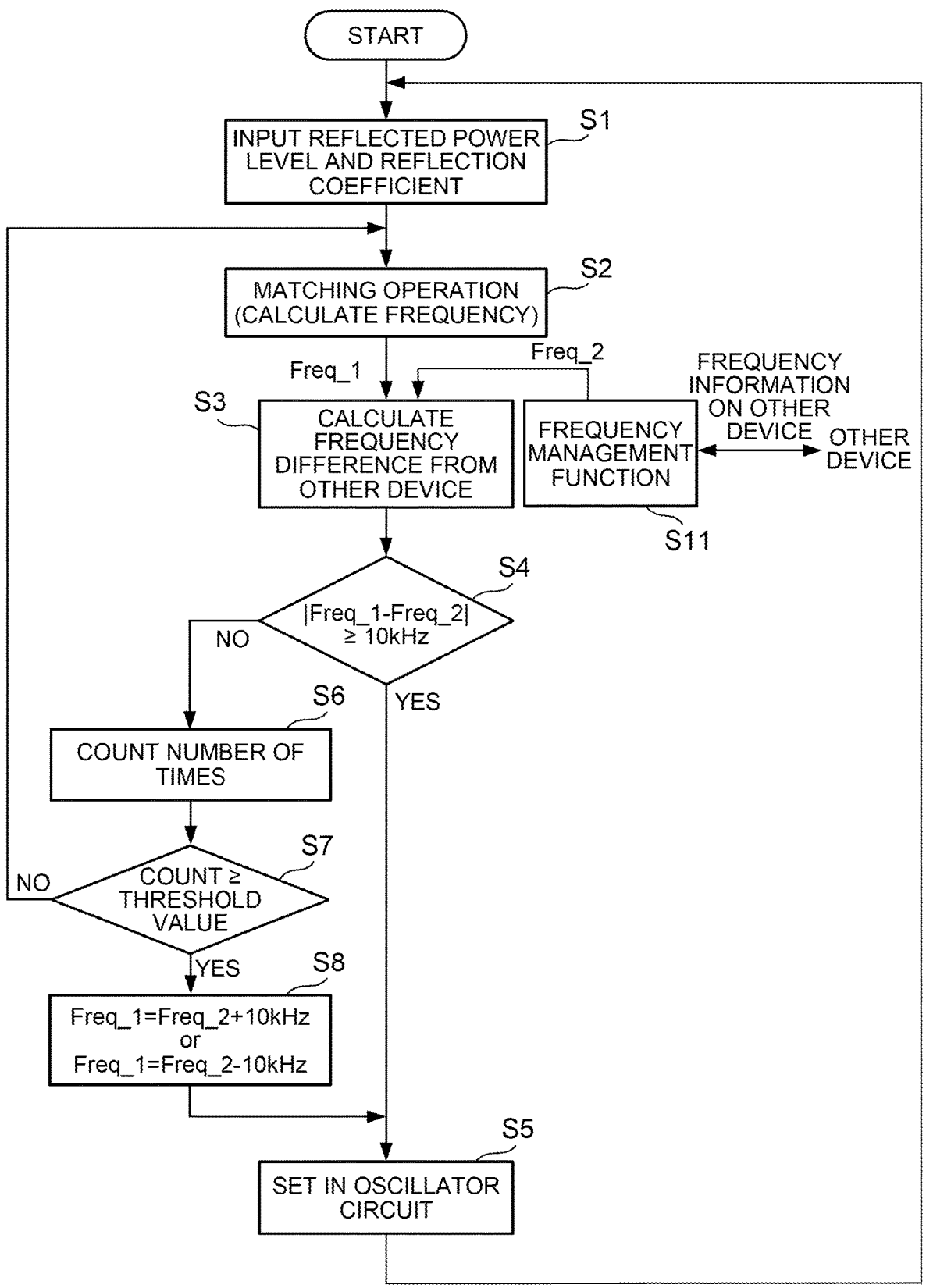
FIG. 7 is a flowchart illustrating processing in a matching arithmetic unit 17 of a RF generator 10.

[Processing of Matching Arithmetic Unit 17: FIG. 7]

Referring next to FIG. 7, processing in the matching arithmetic unit 17 will be described. FIG. 7 is a flowchart illustrating processing in the matching arithmetic unit 17 of the RF generator 10.

As illustrated in FIG. 7, when a reflected power level and a reflection coefficient are input (S1), the matching arithmetic unit 17 performs a matching operation based thereon to calculate a candidate frequency (Freq_1) to be set in the oscillator circuit 11 to make the reflected power level small (S2).

In process S2, a capacitance value for the variable capacitor of the matching box 62 is also calculated and output to the matching box 62, but the illustration thereof is omitted here.

The processing in S2 is the same matching arithmetic processing as that in the first RF generating apparatus.

Further, in the frequency management unit 19, the oscillation frequency (second oscillation frequency: Freq_2) of the RF generator 20 is acquired from the frequency management unit 29 of the RF generator 20 and held by the frequency management function (S11).

Then, the matching arithmetic unit 17 acquires the second oscillation frequency (Freq_2) from the frequency management unit 19 to determine a difference (|Freq_1−Freq_2|) between the candidate frequency Freq_1 calculated in process S2 and the acquired second oscillation frequency Freq_2 (S3).

Then, the matching arithmetic unit 17 determines whether the difference |Freq_1−Freq_2| calculated in process S3 is 10 kHz or more (S4).

Here, since the digital filters of the arithmetic circuits 16, 26 have a feature to let a range of the center frequency (oscillation frequency)±10 kHz through, it is checked whether the difference between the candidate frequency and the second oscillation frequency is 10 kHz or more.

In process S4, when the frequency difference is 10 kHz or more (in the case of Yes), the matching arithmetic unit 17 determines the candidate frequency calculated in process S2 to be the first oscillation frequency to output the first oscillation frequency to the frequency setting circuit 18 so as to set the first oscillation frequency in the oscillator circuit 11 and output the first oscillation frequency to the frequency management unit 19 (S5).

Then, the procedure returns to process S1 to repeat the processing.

On the other hand, when the frequency difference is less than 10 kHz in process S4 (in the case of No), the matching arithmetic unit 17 counts (increments) the number of frequency difference calculations (the number of repetitions) (S6) to determine whether the count (the number of times) is a preset threshold value or more (S7).

When the number of repetitions does not reach the threshold value in process S7 (in the case of No), the matching arithmetic unit 17 returns to process S2 to receive input of the reflected power level and the reflection coefficient from the arithmetic circuit 16 so as to perform a matching operation again in order to calculate a candidate frequency.

When the frequency difference is less than 10 kHz, since an interference wave component will be generated in the passband of the digital filter if the candidate frequency Freq_1 is set directly in the oscillator circuit 11, the interference waves cannot be removed. In this case, since the current candidate frequency Freq_1 is not an appropriate value, the matching arithmetic unit 17 newly acquires a reflected power level and the like to perform an operation again.

On the other hand, when the count reaches the threshold value in process S7 (in the case of Yes), the matching arithmetic unit 17 determines, for the candidate frequency Freq_1, a frequency (Freq_1=Freq_2+10 kHz) obtained by adding 10 kHz to the second oscillation frequency, or a frequency (Freq_1=Freq_2−10 kHz) obtained by subtracting 10 kHz from the second oscillation frequency to be the first frequency (S8), and proceeds to process S5 to set the determined frequency in the oscillator circuit 11 through the frequency setting circuit 18 (S5).

In other words, when the candidate frequency is not separated by 10 kHz or more from the second oscillation frequency after the matching operation is repeated a predetermined number of times, the matching arithmetic unit 17 determines, to be the first oscillation frequency, a frequency forcibly separated by 10 kHz or more from the second oscillation frequency to end the processing.

In process S8, it may be predetermined whether a frequency on a frequency side higher than the second oscillation frequency Freq_2 is selected or a frequency on a lower frequency side is selected as the first oscillation frequency, or a frequency may be determined appropriately according to the value of the second oscillation frequency.

Process S3 to process S8 constitute the frequency interlock processing. The processing by the matching arithmetic unit 17 is thus performed.

Thus, in the power source apparatus, the plurality of RF generators can use the digital filters of the arithmetic circuits surely to attenuate interference wave components affected by a RF from any other power source so that forward power and reflected power without including any interference wave component can be detected to calculate the forward power level and the reflected power level accurately in order to improve power efficiency by performing further stable matching operation.

Here, the frequency interlock processing is performed in the RF generator 10 as the master unit, and the RF generator 20 as the slave unit only notifies the master unit of the oscillation frequency set by itself, but respective roles may be reversed.

In other words, it may be configured such that the master unit notifies the slave unit of the oscillation frequency set by itself, and based on the information, the slave unit performs the frequency interlock processing to set an own oscillation frequency to make the oscillation frequency difference become 10 kHz or more.

Further, the upper apparatus 68 may be configured to acquire frequencies as candidates from the frequency management units 19, 29 of the two RF generators 10 and 20 so as to control a difference between the two frequencies to be 10 kHz or more.

In this case, only the oscillation frequency of one RF generator may be adjusted, or the oscillation frequencies of both of the RF generators may be adjusted.

In this case, the frequency management units 19, 29 send the upper apparatus 68 frequencies as candidates, and set oscillation frequencies specified by the upper apparatus 68 in the oscillator circuits 11, 21 through the matching arithmetic circuits 17, 27 and the frequency setting circuits 18, 28.

It is preset, as operation mode, whether the operation is controlled by the master unit, the operation is controlled by the slave unit, or the operation is controlled by the upper apparatus 68 so that each apparatus performs processing according to the set operation mode.

[Another Structure of Digital Filter]

In the above-described example, the digital filters 51, 54 of the arithmetic circuit 16 are described as band-pass filters, but the digital filters 51, 54 may also be low-pass filters which let a band of a specific frequency or less through with respect to a baseband signal.

In this case, the cut-off frequency of each low-pass filter is set to a frequency higher by a specific bandwidth (for example, 10 kHz) than the output frequency of the RF generator 10. Thus, a frequency lower than the output frequency of the RF generator 10+10 kHz passes through, and an interference wave component equal to or higher than the output frequency of RF power +10 kHz is removed.

The operation of the matching arithmetic unit 17 in the case of using low-pass filters will be briefly described.

Like in the case of using the band-pass filters, a candidate frequency as a candidate for the oscillation frequency is calculated in the matching arithmetic unit 17 to make the reflected power level small. Then, based on the candidate frequency, the oscillation frequency is so determined that the own oscillation frequency will be lower by a specific frequency (for example, 10 kHz) than the oscillation frequency of the other RF generator 20.

In the case of band-pass filters, the own oscillation frequency is compared with the oscillation frequency of the other RF generator 20. In this case, the own frequency may be higher or lower as long as it is separated by the specific frequency. On the other hand, in the case of low-pass filters, the own oscillation frequency is determined to be a frequency on the side lower than the oscillation frequency of the other RF generator 20.

In other words, the cut-off frequency of the low-pass filters becomes the own oscillation frequency +10 kHz.

Thus, since the interference wave component caused by the RF generator 20 becomes higher than the cut-off frequency of the low-pass filters and is attenuated by the digital filters 51, 54 to enable the forward power level and the reflected power level to be calculated accurately.

Like in the case of band-pass filters, the matching arithmetic unit 17 sets an NCO frequency according to the oscillation frequency so that the cut-off frequency can always be set to the oscillation frequency+the specific frequency even when the oscillation frequency varies and hence can remove the interference wave component without fail.

Further, like in the case of band-pass filters, when a frequency separated by the specific frequency from the oscillation frequency of the other RF generator cannot be determined as a candidate frequency after the matching operation is performed a predetermined number of times, a frequency (on the low-frequency side) separated by a specific frequency or more (here, 10 kHz or more) is forcibly set in the oscillator circuit.

[Effects of Second Embodiment]

According to the second RF generating apparatus, the plurality of RF generators 10, 20 and the plurality of matching boxes 62, 65 are included, where one RF generator 10 includes the arithmetic circuit 16 provided with the digital filter 51 having a passband of a specific frequency width from a center frequency set by using the frequency of a forward power or a reflected power as the center frequency, the frequency management unit 19 stores the oscillation frequency of the other RF generator 20, the matching arithmetic unit 17 calculates a candidate frequency as a candidate for the oscillation frequency to make the reflected power level small, and based on the candidate frequency, the RF generator 10 determines an oscillation frequency to make a frequency difference between the oscillation frequency of the other RF generator 20 and the own oscillation frequency becomes the specific frequency or more. Therefore, frequencies in the plurality of RF generators 10, 20 can be controlled to be always separated from each other by the specific frequency difference or more to remove interference wave components respectively contained in detection signals of reflected power by using the digital filters 51, 54 without fail so as to calculate an accurate reflected power level. Thus, there is an advantage of being able to achieve highly accurate matching to improve power efficiency.

Further, according to the second RF generating apparatus, the matching arithmetic unit 17 sets, in the arithmetic circuit 16, information on an NCO frequency corresponding to the oscillation frequency to enable the center frequency of the digital filter 51 to match with the oscillation frequency. Thus, there is an advantage of being able to remove an interference wave component in the digital filter 51 without fail even when the oscillation frequency varies.

Further, according to the second RF generating apparatus, it can be arbitrarily selected which of the master unit, the slave unit, and the upper apparatus performs the frequency interlock processing for controlling frequencies in the plurality of RF generators in conjunction with each other, and this has an advantage of being able to increase the degree of system design freedom.

Further, according to the plasma treatment apparatus of the embodiment, since power is supplied from the above-described RF generating apparatus, impedance matching of RF power can be performed accurately, and this has advantages of being able to generate plasma stably so as to achieve good distribution characteristics in order to perform appropriate plasma processing.

The present invention is suitable for a RF generating apparatus capable of removing interference waves or intermodulation waves to perform stable matching operation in order to improve power efficiency, and a plasma treatment apparatus capable of performing stable plasma processing.

What is claimed is:

1. A RF generating apparatus configured to supply RF power, comprising:

a plurality of RF generators which generate RF power different in frequency; a plurality of antennas installed inside a plasma reactor; and a plurality of matching boxes connected to the antennas to match outputs of the RF generators with one another, each of the RF generators including: an oscillator circuit which oscillates a RF wave having a set oscillation frequency; an arithmetic circuit which calculates a reflected power level and a reflection coefficient from a forward power and a reflected power detected; and a matching arithmetic unit which performs an operation for calculating, based on the reflection coefficient, a control value for the matching box and a candidate value for the oscillation frequency to make the reflected power level small, wherein based on the candidate value for the oscillation frequency, the matching arithmetic unit determines the oscillation frequency to be such a value as to secure a specific frequency difference from an oscillation frequency in any other RF generator and sets the oscillation frequency in the oscillator circuit, and the arithmetic circuit includes a band-pass filter having a bandwidth which is twice the specific frequency difference and sets a center frequency of a passband of the band-pass filter as the set oscillation frequency.

2. The RF generating apparatus according to claim 1, wherein when the specific frequency difference from the oscillation frequency in any other RF generator cannot be secured, the matching arithmetic unit repeats the oscillation frequency operation and forcibly determines such an oscillation frequency as to secure the specific frequency difference after the operation is performed a specific number of times and sets the oscillation frequency in the oscillator circuit.

3. The RF generating apparatus according to claim 1, wherein the plurality of antennas are connected to the matching boxes, respectively.

4. A plasma treatment apparatus using the RF generating apparatus according to claim 1.

5. A RF generating apparatus configured to supply RF power, comprising:

a plurality of RF generators which generate RF power different in frequency; a plurality of antennas installed inside a plasma reactor; and a plurality of matching boxes connected to the antennas to match outputs of the RF generators with one another, each of the RF generators including: an oscillator circuit which oscillates a RF wave having a set oscillation frequency; an arithmetic circuit which calculates a reflected power level and a reflection coefficient from a forward power and a reflected power detected; and a matching arithmetic unit which performs an operation for calculating, based on the reflection coefficient, a control value for the matching box and a candidate value for the oscillation frequency to make the reflected power level small, wherein based on the candidate value for the oscillation frequency, the matching arithmetic unit determines the oscillation frequency to be such a value as to secure a specific frequency difference from an oscillation frequency in any other RF generator and sets the oscillation frequency in the oscillator circuit, and the arithmetic circuit includes such a low-pass filter as to let a band lower than a cut-off frequency through and sets the cut-off frequency as a frequency obtained by adding the specific frequency difference to the set oscillation frequency.

6. The RF generating apparatus according to claim 5, wherein when the specific frequency difference from the oscillation frequency in any other RF generator cannot be secured, the matching arithmetic unit repeats the oscillation frequency operation and forcibly determines such an oscillation frequency as to secure the specific frequency difference after the operation is performed a specific number of times and sets the oscillation frequency in the oscillator circuit.

7. The RF generating apparatus according to claim 5, wherein the plurality of antennas are connected to the matching boxes, respectively.

8. A plasma treatment apparatus using the RF generating apparatus according to claim 5.

9. A RF generating apparatus configured to supply RF power, comprising:

a plurality of RF generators which generate RF power different in frequency; a plurality of antennas installed inside a plasma reactor; and a plurality of matching boxes connected to the antennas to match outputs of the RF generators with one another, each of the RF generators including: an oscillator circuit which oscillates a RF wave having a set oscillation frequency; an arithmetic circuit which calculates a reflected power level and a reflection coefficient from a forward power and a reflected power detected; and a matching arithmetic unit which performs an operation for calculating, based on the reflection coefficient, a control value for the matching box and a candidate value for the oscillation frequency to make the reflected power level small, and the RF generating apparatus further comprising an upper apparatus connected to the plurality of RF generators, wherein based on the candidate value for the oscillation frequency, the upper apparatus determines the oscillation frequency to be such a value as to secure a specific frequency difference from an oscillation frequency in any other RF generator and sets the oscillation frequency in the oscillator circuit.

10. The RF generating apparatus according to claim 9, wherein the arithmetic circuit includes a band-pass filter having a bandwidth which is twice the specific frequency difference and sets a center frequency of a passband of the band-pass filter as the set oscillation frequency.

11. The RF generating apparatus according to claim 9, wherein the arithmetic circuit includes such a low-pass filter as to let a band lower than a cut-off frequency through and sets the cut-off frequency as a frequency obtained by adding the specific frequency difference to the set oscillation frequency.

12. The RF generating apparatus according to claim 9, wherein when the specific frequency difference from the oscillation frequency in any other RF generator cannot be secured, the upper apparatus causes the matching arithmetic unit to repeat the oscillation frequency operation and forcibly determines such an oscillation frequency as to secure the specific frequency difference after the operation is performed a specific number of times and sets the oscillation frequency in the oscillator circuit.

13. The RF generating apparatus according to claim 10, wherein when the specific frequency difference from the oscillation frequency in any other RF generator cannot be secured, the upper apparatus causes the matching arithmetic unit to repeat the oscillation frequency operation and forcibly determines such an oscillation frequency as to secure the specific frequency difference after the operation is performed a specific number of times and sets the oscillation frequency in the oscillator circuit.

14. The RF generating apparatus according to claim 11, wherein when the specific frequency difference from the oscillation frequency in any other RF generator cannot be secured, the upper apparatus causes the matching arithmetic unit to repeat the oscillation frequency operation and forcibly determines such an oscillation frequency as to secure the specific frequency difference after the operation is performed a specific number of times and sets the oscillation frequency in the oscillator circuit.

15. The RF generating apparatus according to claim 9, wherein the plurality of antennas are connected to the matching boxes, respectively.

16. A plasma treatment apparatus using the RF generating apparatus according to claim 9.

* * * * *